United States Patent
Liu et al.

(10) Patent No.: US 9,524,415 B2
(45) Date of Patent: Dec. 20, 2016

(54) TEST TECHNIQUES FOR ASSESSING ULTRASONIC FINGERPRINT SENSORS

(71) Applicant: QUALCOMM Incorporated, San Diego, CA (US)

(72) Inventors: Jianwei Liu, Fremont, CA (US); Norman Satoru Himaka, Spring Valley, CA (US); Sherman Sebastian Antao, San Diego, CA (US); Micah Timothy Lawrence, San Diego, CA (US); David William Burns, San Jose, CA (US); Kostadin Dimitrov Djordjev, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 127 days.

(21) Appl. No.: 14/553,823

(22) Filed: Nov. 25, 2014

(65) Prior Publication Data

US 2016/0019408 A1     Jan. 21, 2016

Related U.S. Application Data

(60) Provisional application No. 62/026,536, filed on Jul. 18, 2014.

(51) Int. Cl.
*G06K 9/00* (2006.01)
*G01R 31/28* (2006.01)
*H01H 11/00* (2006.01)

(52) U.S. Cl.
CPC ......... *G06K 9/0002* (2013.01); *G01R 31/2829* (2013.01); *H01H 11/0062* (2013.01)

(58) Field of Classification Search
CPC .............. G06K 9/0002; G01R 31/2829; H01H 11/0062

(Continued)

(56) References Cited

U.S. PATENT DOCUMENTS

| 4,331,021 A | 5/1982 | Lopez et al. |
| 5,117,189 A | 5/1992 | Terminiello et al. |

(Continued)

FOREIGN PATENT DOCUMENTS

| WO | WO-2008103708 A1 | 8/2008 |
| WO | WO-2011112622 A1 | 9/2011 |

OTHER PUBLICATIONS

International Search Report and Written Opinion—PCT/US2015/035101—ISA/EPO—Dec. 16, 2015.

*Primary Examiner* — Yosef Kassa
(74) *Attorney, Agent, or Firm* — Shirin Tefagh

(57) ABSTRACT

Techniques for testing ultrasonic fingerprint sensors include operating a fingerprint impress simulator that may cyclically press a contact pad of the simulator against a platen of an ultrasonic sensor under test. A control electronics arrangement may operate the ultrasonic sensor under test and the fingerprint impress simulator, and may receive ultrasonic image data from the ultrasonic sensor under test. The ultrasonic sensor may include an ultrasonic transmitter and an ultrasonic sensor array disposed between the ultrasonic transmitter and the platen. The control electronics arrangement may cause the ultrasonic transmitter to emit an ultrasonic pulse, and may receive ultrasonic image data from the ultrasonic sensor array, the ultrasonic image data being converted from a detected portion of the ultrasonic pulse.

28 Claims, 7 Drawing Sheets

(58) Field of Classification Search
 USPC ...... 382/115, 116, 124, 128; 340/5.81, 5.82, 340/5.83
 See application file for complete search history.

(56) References Cited

U.S. PATENT DOCUMENTS

| | | | |
|---|---|---|---|
| 5,388,467 A | 2/1995 | Jereb et al. | |
| 7,077,015 B2* | 7/2006 | Hayward | G06K 9/00013 73/862.041 |
| 7,180,643 B2* | 2/2007 | Carver | G02B 5/32 359/15 |
| 7,400,750 B2* | 7/2008 | Nam | G06K 9/0002 382/124 |
| 7,486,810 B1* | 2/2009 | Accapadi | G06F 21/32 382/124 |
| 7,688,314 B2* | 3/2010 | Abdallah | G06F 21/32 345/156 |
| 7,739,912 B2* | 6/2010 | Schneider | A61B 5/1172 382/124 |
| 8,139,827 B2* | 3/2012 | Schneider | G01N 29/06 382/123 |
| 8,201,739 B2* | 6/2012 | Schneider | G06K 9/0002 235/439 |
| 8,384,514 B2* | 2/2013 | Novack | G06F 21/32 235/426 |
| 8,604,906 B1* | 12/2013 | Halferty | G05B 1/01 340/5.83 |
| 2008/0223701 A1 | 9/2008 | Baima | |
| 2009/0074256 A1 | 3/2009 | Haddad | |
| 2012/0146956 A1 | 6/2012 | Jenkinson | |
| 2013/0070977 A1 | 3/2013 | Orandi et al. | |
| 2013/0345864 A1 | 12/2013 | Park | |

* cited by examiner

TEST TECHNIQUES FOR ASSESSING ULTRASONIC FINGERPRINT SENSORS

CROSS-REFERENCE TO RELATED APPLICATIONS

This disclosure claims priority to U.S. Provisional Patent Application No. 62/026,536, filed Jul. 18, 2014, entitled "Test Techniques for Assessing Ultrasonic Fingerprint Sensors", and assigned to the assignee hereof. The disclosure of the prior application is considered part of and is incorporated by reference in this patent application.

TECHNICAL FIELD

This disclosure relates to techniques for testing ultrasonic fingerprint sensors, and more particularly to test methods and apparatus for efficient performance of cyclic life testing and high volume quality control testing of ultrasonic fingerprint sensors.

DESCRIPTION OF THE RELATED TECHNOLOGY

In an ultrasonic sensor system, an ultrasonic transmitter may send one or more ultrasonic waves through an ultrasonically transmissive medium or media and towards an object to be detected. The transmitter is operatively coupled with an ultrasonic sensor configured to detect portions of the ultrasonic wave that are reflected from the object. For example, in ultrasonic fingerprint imagers, an ultrasonic pulse may be produced by starting and stopping the transmitter during an interval of time. At each material interface encountered by the ultrasonic pulse, a portion of the ultrasonic pulse is reflected.

In an ultrasonic fingerprint imager, the ultrasonic wave may travel through a platen on which a person's finger may be placed to obtain a fingerprint image. After passing through the platen, some portions of the ultrasonic wave encounter skin that is in contact with the platen, e.g., fingerprint ridges, while other portions of the ultrasonic wave encounter air, e.g., valleys between adjacent ridges of a fingerprint, and may be reflected with different intensities back towards the ultrasonic sensor. The reflected signals associated with the finger may be processed and converted to a digital value representing the signal strength of the reflected signal. When multiple such reflected signals are collected over a distributed area, the digital values of such signals may be used to produce a graphical display of the signal strength over the distributed area, for example by converting the digital values to an image, thereby producing an image of the fingerprint. Thus, an ultrasonic sensor system may be used as a fingerprint imager or other type of biometric scanner. In some implementations, the detected signal strength may be mapped into a contour map of the finger that is representative of the depth of the ridge structure detail.

An ultrasonic sensor system for fingerprint imaging has been described in U.S. Pat. No. 8,201,739, assigned to the assignee of the present invention. The sensor system may include a multilayer stack including one or more substrates, piezoelectric materials, active electronic devices, electrodes and other passive layers.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus for testing ultrasonic fingerprint sensors. The apparatus includes a fingerprint impress simulator that cyclically presses a contact pad of the simulator against a platen of an ultrasonic sensor under test. A control electronics arrangement operates the ultrasonic sensor under test and the fingerprint impress simulator, and receives ultrasonic image data from the ultrasonic sensor under test.

According to some implementations, the apparatus includes a fingerprint impress simulator that cyclically presses a contact pad against a platen of an ultrasonic sensor under test, and a control electronics arrangement that operates the ultrasonic sensor under test and the fingerprint impress simulator, and receives ultrasonic image data from the ultrasonic sensor under test.

In some examples, the ultrasonic sensor may include an ultrasonic transmitter and an ultrasonic sensor array disposed between the ultrasonic transmitter and the platen. The control electronics arrangement may cause the ultrasonic transmitter to emit an ultrasonic pulse, and receives ultrasonic image data from the ultrasonic sensor array, the ultrasonic image data corresponding to a detected portion of the ultrasonic pulse. In some examples, the control electronics arrangement may synchronize a motion of the fingerprint impress simulator and operation of the ultrasonic sensor under test such that the detected portion of the ultrasonic pulse is reflected from the contact pad. The fingerprint impress simulator may include (i) a plurality of elongated testing beams; (ii) a plurality of contact pads, each contact pad attached proximate to a distal end of a respective one of the plurality of elongated testing beams; and (iii) a mechanism that articulates the respective elongated testing beams so as to cyclically engage and disengage the contact pads with respective ultrasonic sensors under test. The mechanism may include a rotatable drum arrangement mechanically coupled with the respective elongated testing beams by a linkage arrangement, the linkage arrangement being configured to cause a rotation of the rotatable drum to result in articulation of the respective elongated testing beams so as to cyclically engage and disengage the contact pads with respective ultrasonic sensors under test. The linkage arrangement may be configured to cyclically move the distal end of at least one of the respective elongated testing beams along a line of motion that is substantially orthogonal to a long axis of the elongated testing beam. The linkage arrangement is configured to provide that a first edge portion of the contact pad makes an initial contact with a surface of the ultrasonic sensor and, only subsequent to the initial contact, a remaining portion of the contact pad is then pressed against the surface. The linkage arrangement may be configured to provide that a heel portion of the contact pad may be set to engage the surface prior to a toe portion. The linkage arrangement may be configured to move the distal end alternately in opposing directions along the line of motion. The linkage arrangement may include at least one of a cam, a roller, a bearing, a bushing, an integral cam, a protruding section, an offset cylinder and an eccentric. The mechanism may include a stepper motor or a plurality of pneumatically or hydraulically driven pistons.

In some examples, the control electronics arrangement may be configured to selectably control a pressure with which the fingerprint impress simulator presses the contact pad against the platen.

In some examples, the contact pad may be configured with a test pattern having a spatial frequency range simulating a fingerprint.

In some examples, the contact pad may be fabricated from a material having one or more of a stiffness and an acoustic impedance characteristic that simulate skin of a finger.

In some examples, the control electronics arrangement may sequence the fingerprint impress simulator through each of a plurality of ultrasonic sensors under test in round-robin fashion.

In some examples, the control electronics arrangement may generate a contrast transfer function output.

In some implementations, a method includes cyclically pressing a contact pad against a platen of an ultrasonic sensor under test with a fingerprint impress simulator, and operating, with a control electronics arrangement, the ultrasonic sensor under test and the fingerprint impress simulator, and receiving ultrasonic image data from the ultrasonic sensor under test.

In some examples, the ultrasonic sensor may include an ultrasonic transmitter and an ultrasonic sensor array disposed between the ultrasonic transmitter and the platen. The method may include causing the ultrasonic transmitter to emit an ultrasonic pulse, and receiving ultrasonic image data from the ultrasonic sensor array, the ultrasonic image data corresponding to a detected portion of the ultrasonic pulse. The control electronics arrangement may synchronize a motion of the fingerprint impress simulator and operation of the ultrasonic sensor under test such that the detected portion of the ultrasonic pulse is reflected from the contact pad.

In some examples, the fingerprint impress simulator may include (i) a plurality of elongated testing beams; (ii) a plurality of contact pads, each contact pad attached proximate to a distal end of a respective one of the plurality of elongated testing beams; and (iii) a mechanism that articulates the respective elongated testing beams so as to cyclically engage and disengage the contact pads with respective ultrasonic sensors under test. The mechanism may include a rotatable drum arrangement mechanically coupled with the respective elongated beams by a linkage arrangement, the linkage arrangement being configured to cause a rotation of the rotatable drum to result in articulation of the respective elongated testing beams so as to cyclically engage and disengage the contact pads with respective ultrasonic sensors under test.

In some examples, the control electronics arrangement may be configured to selectably control a pressure with which the fingerprint impress simulator engages the contact pads with the respective ultrasonic sensors.

In some examples, the method may further include generating a contrast transfer function output.

In some examples, the contact pad may be fabricated from a material having one or more of a stiffness and an acoustic impedance characteristic that simulate skin of a finger.

In some implementations, a non-transitory computer readable medium having software stored thereon, the software including instructions for causing an apparatus to cyclically press an contact pad against a platen of an ultrasonic sensor under test with a fingerprint impress simulator, and operate, with a control electronics arrangement, the ultrasonic sensor under test and the fingerprint impress simulator, and receive ultrasonic image data from the ultrasonic sensor under test.

In some implementations, the apparatus includes a fingerprint impress simulator that cyclically presses a contact pad against a platen of an ultrasonic sensor under test; and means for operating the ultrasonic sensor under test and the fingerprint impress simulator, and receiving ultrasonic image data from the ultrasonic sensor under test.

BRIEF DESCRIPTION OF THE DRAWINGS

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale. Like reference numbers and designations in the various drawings indicate like elements.

DETAILED DESCRIPTION

Figure 1:
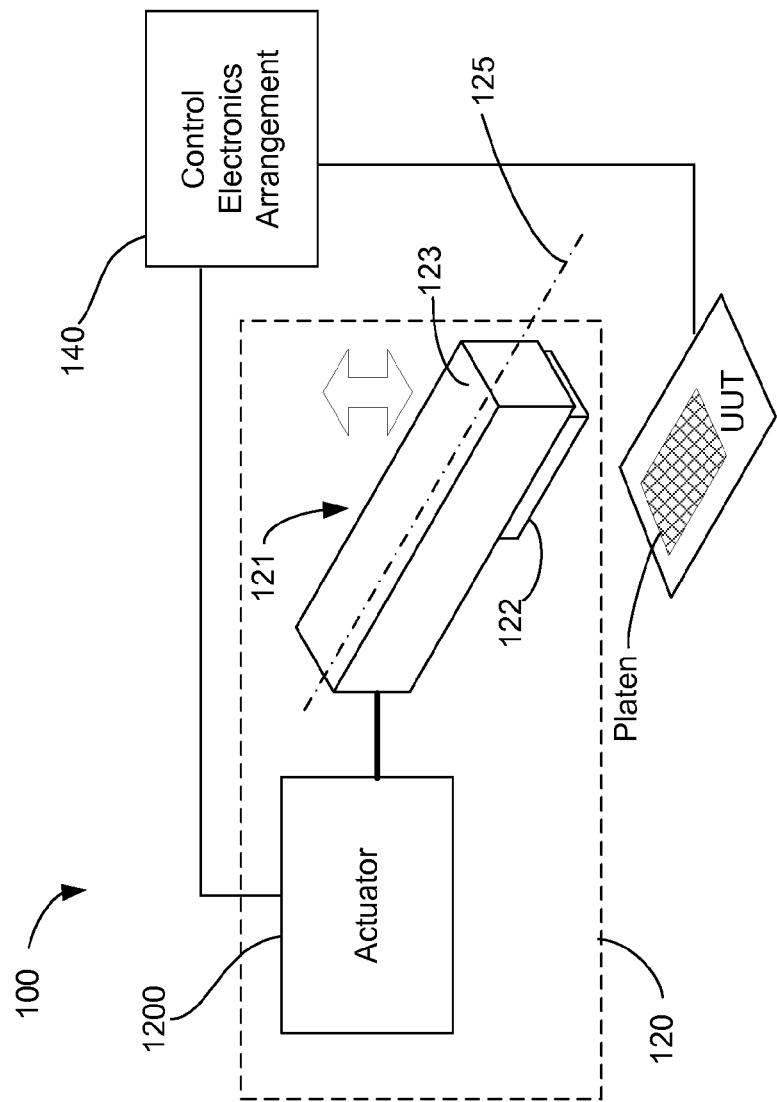
FIG. 1 shows an example of a testing apparatus for determining performance of an ultrasonic fingerprint sensor.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes a touch/fingerprint sensing system. In addition, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Ultrasonic fingerprint sensors may be required to survive millions of finger touch cycles, during which fingerprint images may be taken. Such sensors may include a multilayer stack including one or more substrates, piezoelectric materials, active electronic devices, electrodes and other passive layers. Mechanical or chemical damage to the platen and layers below the platen, and/or mechanical and electrical performance degradation of the multilayer stack, may result in unacceptable functional performance. Accordingly, testing techniques that efficiently and accurately monitor and characterize the performance of ultrasonic fingerprint imaging sensors over time during, for example, life and reliability testing, are desirable.

Moreover, introduction of ultrasonic fingerprint sensors to the mass consumer market requires techniques for economical high-volume quality control testing of production sensors. More particularly, a test system configured to quickly screen sensors and extract sensor performance parameters such as image contrast and resolution is desirable.

Various implementations disclosed herein may involve a testing system configurable to track performance of an ultrasonic fingerprint sensor over a large number of duty cycles, the testing system also being suitable for high volume testing of production ultrasonic sensors. The testing system may include a mechanical cycling arrangement configured to simulate finger engagement and disengagement with a platen surface of an ultrasonic fingerprint sensor (the "unit under test" or "UUT"), and a control electronics arrangement that acquires fingerprint image data. In some implementations, the mechanical cycling arrangement may include multiple finger-like testing beams that may be articulated by a pneumatic or hydraulic piston or a stepper motor. The UUT may include an ultrasonic transmitter and an ultrasonic sensor array that is disposed between the ultrasonic transmitter and the platen.

In some implementations, a contact pad with a specific test pattern, which may represent a range of anticipated fingerprint spatial frequencies or other suitable pattern, may be disposed on each testing beam such that articulation of the testing beam causes the contact pad to engage with a respective individual UUT positioned under the testing beam. The contact pad and/or the testing beam may be formed of a material that simulates the stiffness and acoustic impedance of a human finger surface. In some implementations, the contact pad may have an elastomeric surface and/or be composed of an elastomeric material. As the contact pad is brought into contact with a platen surface of the UUT, the control electronics arrangement may cause the UUT to operate, i.e., to emit, with the ultrasonic transmitter an ultrasonic pulse, and may receive ultrasonic image data from the ultrasonic sensor array. The ultrasonic image data from a detected portion of the ultrasonic pulse may be converted to digital image data. The conversion may be performed, for example, at the sensor array, at an associated application-specific integrated circuit (ASIC), or at the control electronics arrangement.

Thus, image data corresponding to the test pattern may be collected and analyzed by the control electronics arrangement. For example, image contrast between the "ridges" and "valleys" may be calculated as a function of the spatial frequencies of the pattern. A modulation transfer function (MTF) curve may be constructed as an indication of the sensor's performance. During a reliability/life test, the MTF curve may be monitored for tracking the degradation of sensor performance. To synchronize movement of multiple testing beams and fingerprint image acquisition from multiple UUTs, the control electronics arrangement may control position and movement of the stepper motor or other actuator articulating the testing beams. The control electronics arrangement may also allow communication with a host PC or other recording device to log sensor data, provide an ability to sequence through each of the sensors under test, and include built-in-test capabilities such as voltage, current, and temperature monitoring, for example.

FIG. 1 shows an example of a testing apparatus for determining performance of an ultrasonic fingerprint sensor. The apparatus 100 includes a mechanical cycling arrangement 120 (which may also be referred to as a "finger impress simulator") and a control electronics arrangement 140. The mechanical cycling arrangement 120 includes an actuator 1200 that is controlled by control electronics arrangement 140 and may be configured to impart a cyclic motion to a testing beam 121. As illustrated, the testing beam 121 may be elongated, that is the testing beam 121 may have a length along a long axis that 125 is substantially larger than characteristic dimensions taken in directions orthogonal to the long axis. A contact pad 122 may be disposed on or proximate to a distal portion 123 of testing beam 121. The cyclic motion of the testing beam 121 may cause the contact pad 122 to be cyclically (i) pressed against a platen surface of an ultrasonic sensor (the "unit under test" or UUT); and (ii) separated from the platen surface. In the illustrated implementation, for example, the actuator 1200 may include or be coupled with a linkage arrangement configured to cause the distal portion 123 of the testing beam 121 to cyclically translate back and forth (or, in the illustrated implementation, up and down) along a line of motion substantially orthogonal to the platen surface, and substantially orthogonal to the long axis 125. Thus, the distal end may be caused to move alternately in opposing directions along the line of motion so as to repeatedly engage and disengage the contact pad 122 with the platen surface of the UUT.

In some implementations, actuator 1200 may cause the contact pad 122 to be pressed against the platen with a force simulating that of a typical use case finger press. For example, a force of about 0.5-1 kgf may be applied. The control electronics arrangement 140 may be configured to operate the UUT and to receive ultrasonic image data from the UUT, in synchronization with the cyclic actuation of the testing beam 121.

Figure 2:
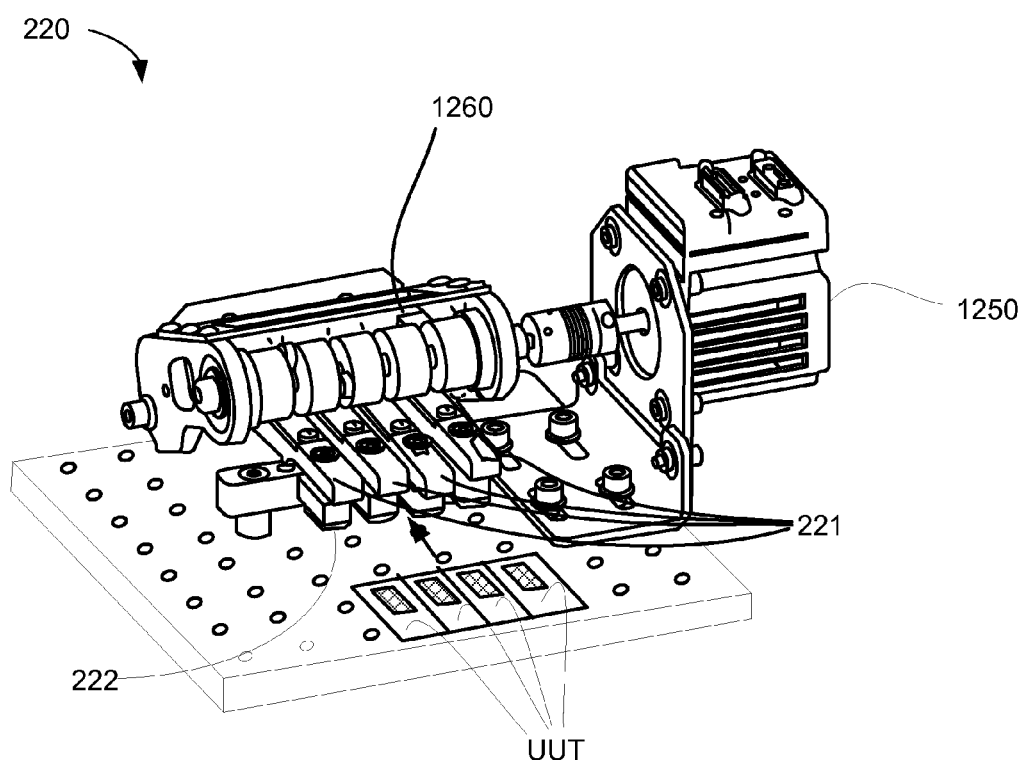
FIG. 2 shows an example of a finger impress simulator according to some implementations.

FIG. 2 shows an example of a finger impress simulator according to some implementations. The finger impress simulator 220 is configured to simulate a finger engaging with and disengaging from a platen surface of the UUT. In the illustrated implementation, the finger impress simulator 220 includes four testing beams 221 actuated by a drum arrangement 1260 that is driven by a motor 1250. In some implementations, the motor 1250 may be a stepper motor. As will be described in more detail hereinbelow, rotary motion of the drum arrangement 1260 may impart a cyclic vertical translation of a distal end of the testing beam 221. A contact pad 222, disposed on a bottom surface of a distal portion of the testing beam 221, may thereby be caused to alternately press down against and lift from a corresponding platen surface of the UUT. In some implementations, the cyclic rate may in the range of 1-2 Hz, for example.

In the illustrated implementation, four testing beams 221 are articulated by the drum arrangement 1260. In some implementation, the fingerprint impress simulator 220 may include a linkage arrangement configured such that rotational motion of the stepper motor 1250 imparts a back and forth or up and down motion, in a substantially vertical direction, to a distal portion of one or more of the testing beams 221. As a result, a distal portion of the testing beam 221 may move toward a respective UUT positioned under the beam 221. The testing beams 221 may be articulated in a sequential manner, or approximately simultaneously. In some implementations, the sequential manner may include approximately simultaneous articulation of two or more of the testing beams 221.

In the illustrated implementation, four UUTs are disposed on a test board such that each UUT is aligned with a respective testing beam 221. A respective contact pad 222 may be disposed near the distal portion of each respective beam 221 and may be configured with a specific test pattern having a spatial frequency range simulating a fingerprint. The beam 221 and/or the contact pad 222 may be fabricated from a material having particular stiffness and acoustic impedance characteristics that are close to those of a human finger. Moreover, the contact pad 222 may be configured with a patterned surface that provides a specific test pattern, which may represent a range of anticipated fingerprint spatial frequencies. As the testing beam 221 is brought into contact on the sensor, image data of the test pattern may be taken and the contrast of the "ridges" and "valleys" may be calculated with respect to the pattern spatial frequency.

Figure 3:
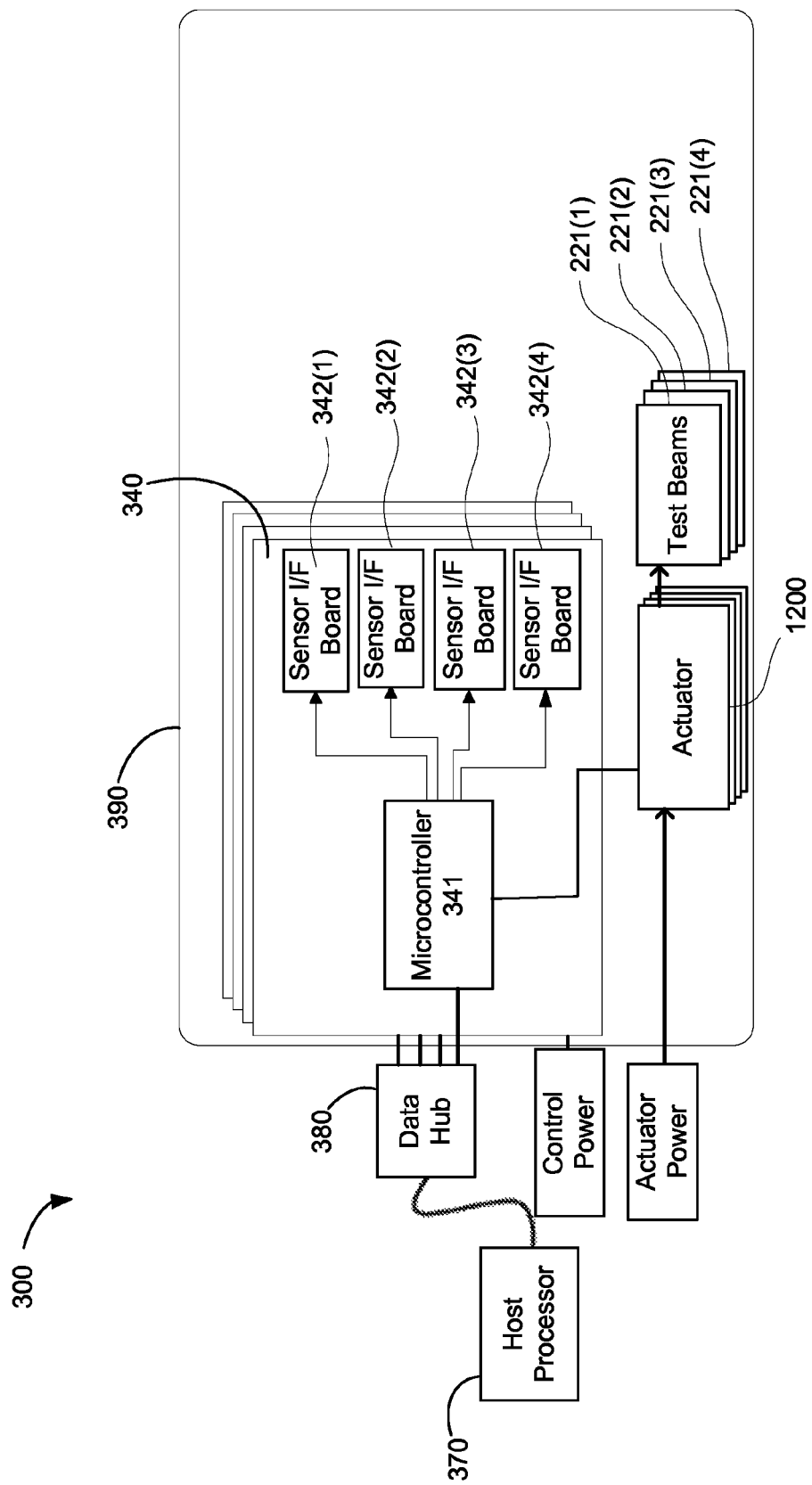
FIG. 3 shows a fingerprint impress simulator testing system according to some implementations.

In some implementations, a testing system control electronics arrangement may synchronize the operation of the fingerprint impress simulator 220 with control of and data acquisition from one or more UUTs. FIG. 3 shows a fingerprint impress simulator testing system according to some implementations. Testing system 300 includes a control electronics arrangement 340. In the illustrated implementation, the control electronics arrangement 340 includes a microcontroller 341 communicatively coupled with four sensor interface boards 342. Control electronics arrangement 340 may also be communicatively coupled with a host processor 370. The control electronics arrangement 340 may be communicatively coupled directly with the host processor 370 (as illustrated), or a data hub 380 may be disposed between the control electronics arrangement 340 and the host processor 370.

For clarity of illustration, FIG. 3 omits depicting a UUT; however, a UUT, during operation of the test system 300 will be disposed to mechanically interact with a test beam 221, as described in connection with FIG. 2, and will be electrically coupled with a sensor interface board 342. More particularly, each sensor interface board 342 may be electrically coupled with and function as an I/O interface with a respective ultrasonic fingerprint sensor or UUT. The control electronics arrangement 340 may, by way of respective sensor interface boards 342, control each of a number of UUTs. In the illustrated implementation, four sensor interface boards 342 are coupled with the single microcontroller 341, but a greater or lesser number of sensor interface boards 342 may be contemplated.

Each UUT may include an insonification device or generator, also referred to as an ultrasonic transmitter, and an ultrasonic sensor array. For example, the sensor array may be positioned between the platen and the ultrasonic transmitter, which may be configured as a plane wave generator. The functionality of the UUT contemplated to be tested by the presently disclosed techniques includes emission of an ultrasonic pulse from the ultrasonic transmitter of the UUT such that the ultrasonic pulse travels through the sensor array and is reflected from a surface of the contact pad 222 (not illustrated). In addition, the UUT may detect, with the sensor array, a portion of the ultrasonic pulse that is reflected from the contact pad 222. The detected portion of the ultrasonic pulse may be converted to digital image data and processed so as to assemble a digital image of the surface of the contact pad 222. In general, the pulse may include one or more cycles of ultrasonic waves, each of which may include waves at one or more frequencies or amplitudes.

In some implementations, the control electronics arrangement 340 provides, by way of the sensor interface board 342, input power and control signals to the UUT, including, for example, the ultrasonic transmitter, and receives the image data from the UUT or associated ASIC. The above-mentioned control and data acquisition functions may be synchronized by the control electronics arrangement 340 with a cyclic operation of the actuator 1200, which may also be controlled by the control electronics arrangement 340. For example, the microcontroller 341 may be configured to automate control of actuator 1200 in parallel with controlling each sensor interface (I/F) board. As a result, the image data may be cost-effectively acquired repetitiously over a large number of cycles, during, for example, life testing of a UUT.

Alternatively or in addition, a large number of UUTs may be tested in parallel with a common test setup. For example, referring still to FIG. 3, in the illustrated implementation, a number of control electronics arrangements 340 may be communicatively coupled with a processor 370 by way of the data hub 380. As a result, a number of actuators 1200 may be operated in parallel to test multiple UUTs substantially simultaneously. In the illustrated implementation, the control electronics arrangement(s) 340 and actuator(s) 1200 may be disposed in a common test chamber 390, which may be an environmental chamber. The test chamber 390 may provide temperature and humidity control, for example, and/or acoustic isolation from a lab ambient environment. Thus, in some implementations, the test chamber 390 may include a number of control electronics arrangements 340 that are communicatively coupled in parallel to the processor 370 by way of data hub 380 (which may be a USB hub, for example). As a result, concurrent control of and data acquisition from multiple control electronics arrangements 340 may be accomplished.

For example, the control electronics arrangement 340 may control position and movement of the actuator 1200, via communication from the microcontroller 341 and communicate to a processor 370, or data storage device, so as to log sensor data acquired from the UUT. In some implementations, the control electronics arrangement 340 may sequence through each of any number of UUTs under test in a round-robin fashion.

In some implementations, contrast transfer function output such as a contrast transfer function (CTF) curve may be constructed as an indicator of each UUT's performance. During a reliability test, the CTF curve may be monitored for tracking the degradation of sensor performance over a large number of cycles. For example, a life test program may contemplate approximately one million cycles.

Figure 4:
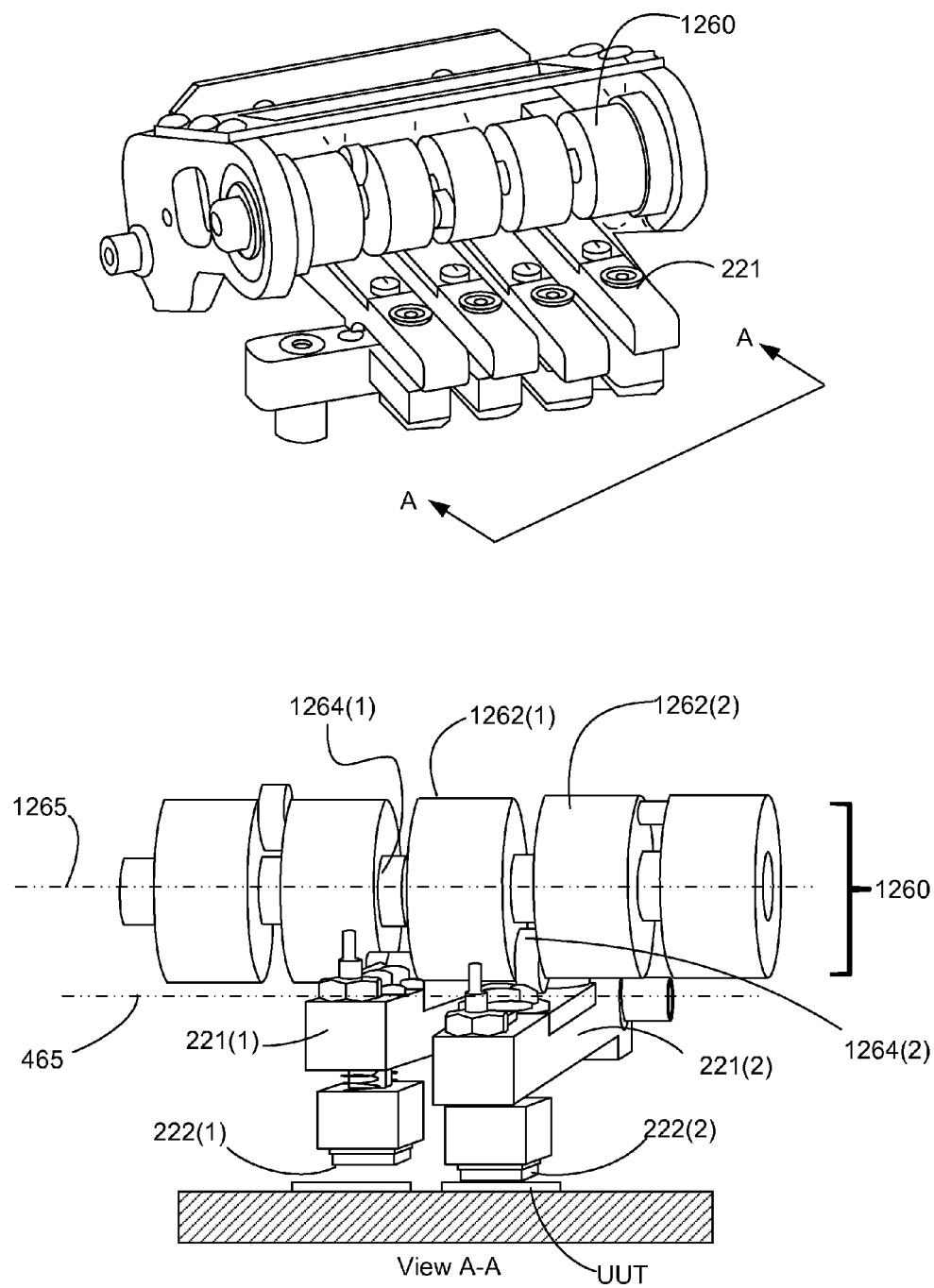
FIG. 4 shows an arrangement for fingerprint impress simulation, according to some implementations.

FIG. 4 shows an arrangement for fingerprint impress simulation according to some implementations. In the illustrated implementation, rotary motion of the drum arrangement 1260 produces, as a result of a linkage arrangement, a back and forth or up and down vertical translation of a distal end of the testing beam 221. The linkage arrangement includes hingedly supporting a proximal end of the testing beam 221 so as to be rotatable about an axis 465. In the illustrated implementation, the drum arrangement 1260 includes four cylinders 1262, each cylinder including at least one cam 1264. A roller, bearing, bushing, eccentric, or other protruding section may serve as a cam 1264. Motor 1250 (not illustrated) may cause drum arrangement 1260, including at least one cylinder 1262, to rotate about axis 1265. During a portion of each complete rotation about axis 1265, one or more cams 1264 may be slidably engaged with a corresponding testing beam 221. For example, referring to View AA, cam 1264(2) is engaged with testing beam 221(2) with a result that the distal portion of the testing beam 221(2) is urged downward, thereby bringing contact pad 222(2) into contact with the UUT.

Figure 5A:
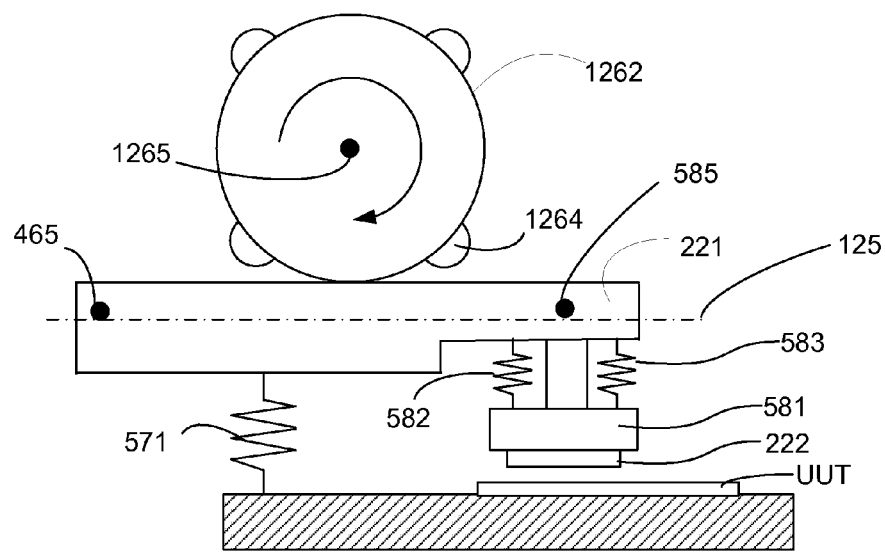
FIGS. 5A through 5D show elevational views of details of fingerprint impress simulators, according to some implementations.

FIGS. 5A through 5D show elevational views of details of fingerprint impress simulators, according to some implementations. In the illustrated views, it may be observed how an orientation of testing beam 221 is effected by a rotation of cylinder 1262 about axis 1265. As indicated above, the testing beam 221 is hingedly supported such that the testing beam 221 is rotatable about axis 465. Referring first to FIG. 5A, a spring 571 may be configured so as to provide an upward force that urges testing beam 221 to remain in contact with or in proximity to cylinder 1262. In the position illustrated in FIG. 5A, the testing beam 221 is approximately horizontal and a gap may be observed between a lower surface of contact pad 222 and an upper surface (or platen) of the UUT.

Figure 5B:
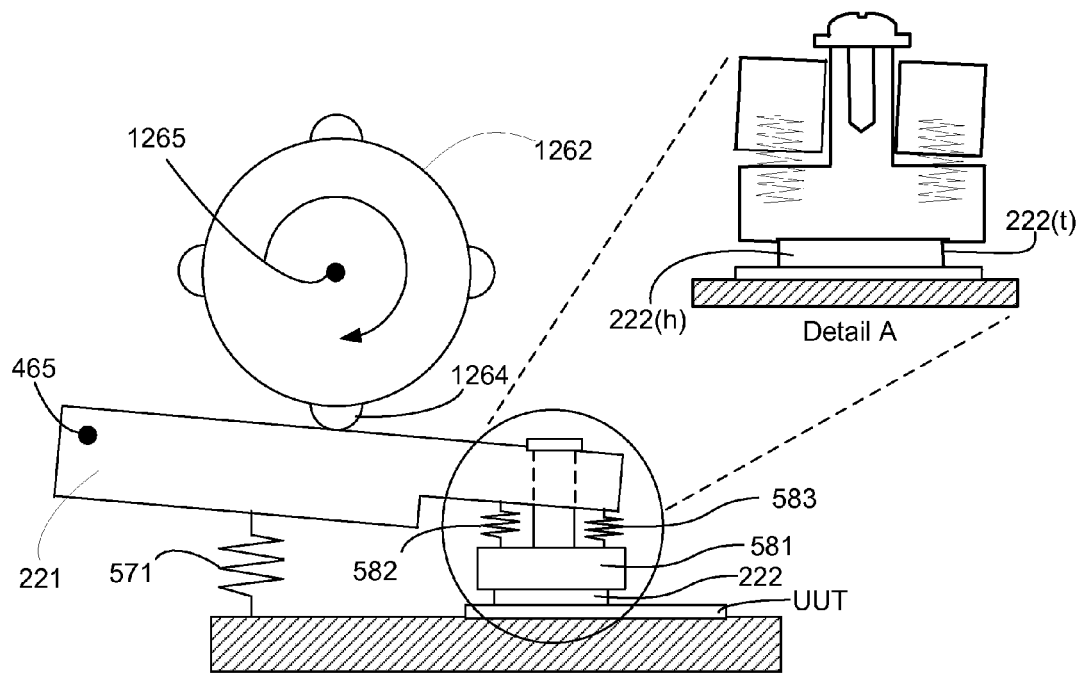

Referring now to FIG. 5B, as a result of rotation of the cylinder 1262 about the axis 1265, the cam 1264 is engaged with an upper surface of the testing beam 221. As a result, the testing beam 221 is urged to rotate about the axis 465, and a distal portion of the testing beam 221 is translated in a downward direction such that contact pad 222 is pressed against the UUT. In the illustrated implementation, the contact pad 222 is disposed upon a lower surface of support block 581. The support block 581 is mechanically coupled with the testing beam 221 by way of a first spring 582 and a second spring 583. The support block 581 may also engage with the testing beam 221 so as to permit some degree of mutual rotation between the support block 581 and the testing beam 221. In the illustrated implementation, for example, an upper portion of the support block 581 protrudes within a slot provided in the testing beam 221. As illustrated in Detail A, the slot may be sized so as to permit rotation about an axis parallel to axis 465 of the support block 581 with respect to the testing beam 221.

In some implementations, articulation of the testing beam 221 may cause contact pad 222 to engage with the UUT in a time sequenced manner that more closely simulates a typical finger press. For example, design parameters of the testing beam 221, the support block 581, springs 582 and 583 are chosen to provide that a first edge portion of the contact pad 222 makes an initial contact with the UUT, and, only subsequent to the initial contact, a remaining portion of the contact pad 222 is then pressed against the UUT. The first edge portion 222(h) opposite to the distal end of the testing beam 221 may be referred to as a "heel portion" of the contact pad 222, and may be set to engage a surface of a sensor prior to a "toe portion" 222(t) that is proximal to the distal end of the testing beam 221.

In some implementations, a force with which contact pad 222 is pressed against the UUT is adjustable. For example, the force may be adjusted by varying a position of cam 1264 with respect to a peripheral edge of cylinder 1262 and/or by varying the spring constant and/or position of springs 582 and 583.

In the implementations illustrated in FIGS. 5A and 5B, four cams 1264 are disposed on the cylinder 1262. As a result, the contact pad 222 may be pressed against the UUT and then displaced or separated from the UUT four times per each revolution of the cylinder 1262. Other configurations are within the contemplation of the present disclosure. For example, referring again to FIG. 4, in some implementations, a single cam 1264 is disposed between each pair of two cylinders 1262. For example, cam 1264(2) is disposed between the cylinder 1262(1) and the cylinder 1262(2). In the illustrated configuration, a phase delay of 90° is provided between each of successive cams such that, during one revolution of drum arrangement 1260, each of four respective contact pads 222 will be pressed against respective UUTs. As a result, time delay between successive UUT tests may be provided.

Figure 5C:
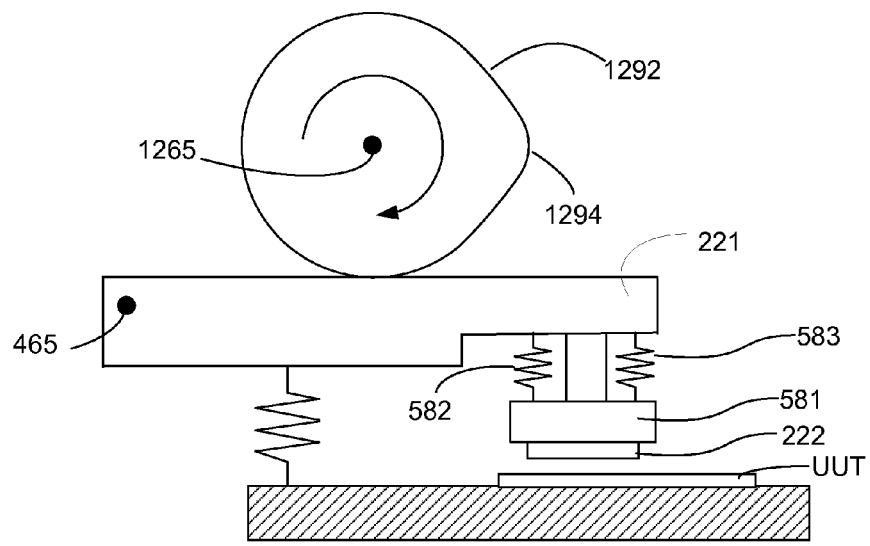
Figure 5D:
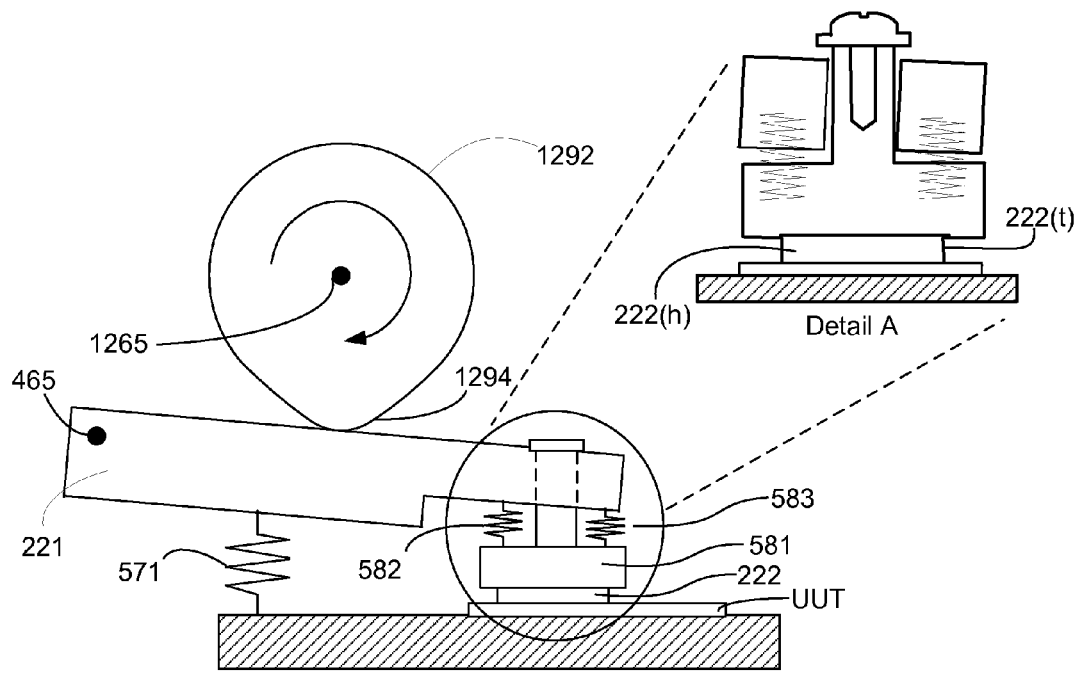

FIGS. 5C and 5D illustrate an implementation in which cylinder 1292 includes an integral cam 1294. As the cylinder 1292 rotates about an axis 1265, the integral cam 1294 may contact the testing beam 221 as shown in FIG. 5D, allowing the contact pad 222 to engage and be pressed against the UUT and then displaced or separated from the UUT once per revolution of the cylinder 1292. By controlling the outer shape of cylinder 1292, a level of engagement force, a time of engagement, and a time delay between successive UUT tests may be provided. The cylinder 1292 may include one or more integral cams 1294. In one example, the integral cam 1294 may result from configuring cylinder 1292 with a first (integral cam) portion at a first radius from an axis 465 that corresponds to an engagement with a UUT and a second (remaining) portion at a second radius that corresponds to a disengagement from the UUT. In another example, the integral cam 1294 may include one or more protruding sections of the cylinder 1292. In another example, the axis 465 of cylinder 1292 may be offset from the center of a round peripheral surface to allow cyclical engagement and disengagement of the contact pad 222 with a UUT. Rollers (not illustrated) or a low-friction layer may be included on or in the testing beams 221 upon which the cylinder 1292 may ride to reduce friction and wear.

In some implementations, the testing beam 221 or support block 581 may include provisions to allow controlled changes in angular rotation of the contact pad 222 between successive cycles of engagement and disengagement between the contact pad 222 and the UUT and/or between successive test runs. For example, an angular rotation about an axis 585 (FIG. 5A) may be stepped a portion of a degree or more between each engagement, or between respective series of engagements, to simulate the variations by which a finger of a user may be positioned on a surface of the sensor.

In some implementations, the testing beam 221 or the support block 581 may include an actuator (not shown) to allow translations in one or more directions of the contact pad 222 during or between successive cycles of engagement. For example, translation of a portion of a millimeter or more may be applied along longitudinal axis 125 and/or in a direction transverse to longitudinal axis 125. The translations may be applied between successive cycles of engagement and disengagement between the contact pad 222 and the UUT and/or between successive test runs, to simulate the variations by which a finger of a user may be positioned on the sensor.

In some implementations, the testing beam 221 or the support block 581 may include provisions to allow small variations in an inclination angle of the contact pad 222 between successive cycles of engagement and disengagement between the contact pad 222 and the UUT and/or between successive test runs. The inclination angle may include components of rotation about one or both of axis 585 and longitudinal axis 125. A change in the inclination angle may therefore change the portion of the contact pad 222 that strikes the sensor surface first (e.g., front, back, left or right).

An amount of abrasive force applied to the sensor surface during engagement may be changed, to simulate the various angles of inclination and slight rubbing that may occur when a finger of a user is positioned on the sensor. In some implementations, the testing beam 221 or the support block 581 may include an actuator (not shown) to impart variations in a roll angle of the contact pad 222 between or during cycles of engagement. For example, a small change in the roll angle may change the portion of the contact pad 222 that strikes the sensor surface, to simulate the roll of a finger on the sensor during use. In some implementations, the temperature of the contact pad 222 may be controlled or adjusted during cycling to simulate the temperature of a finger.

Figure 6:
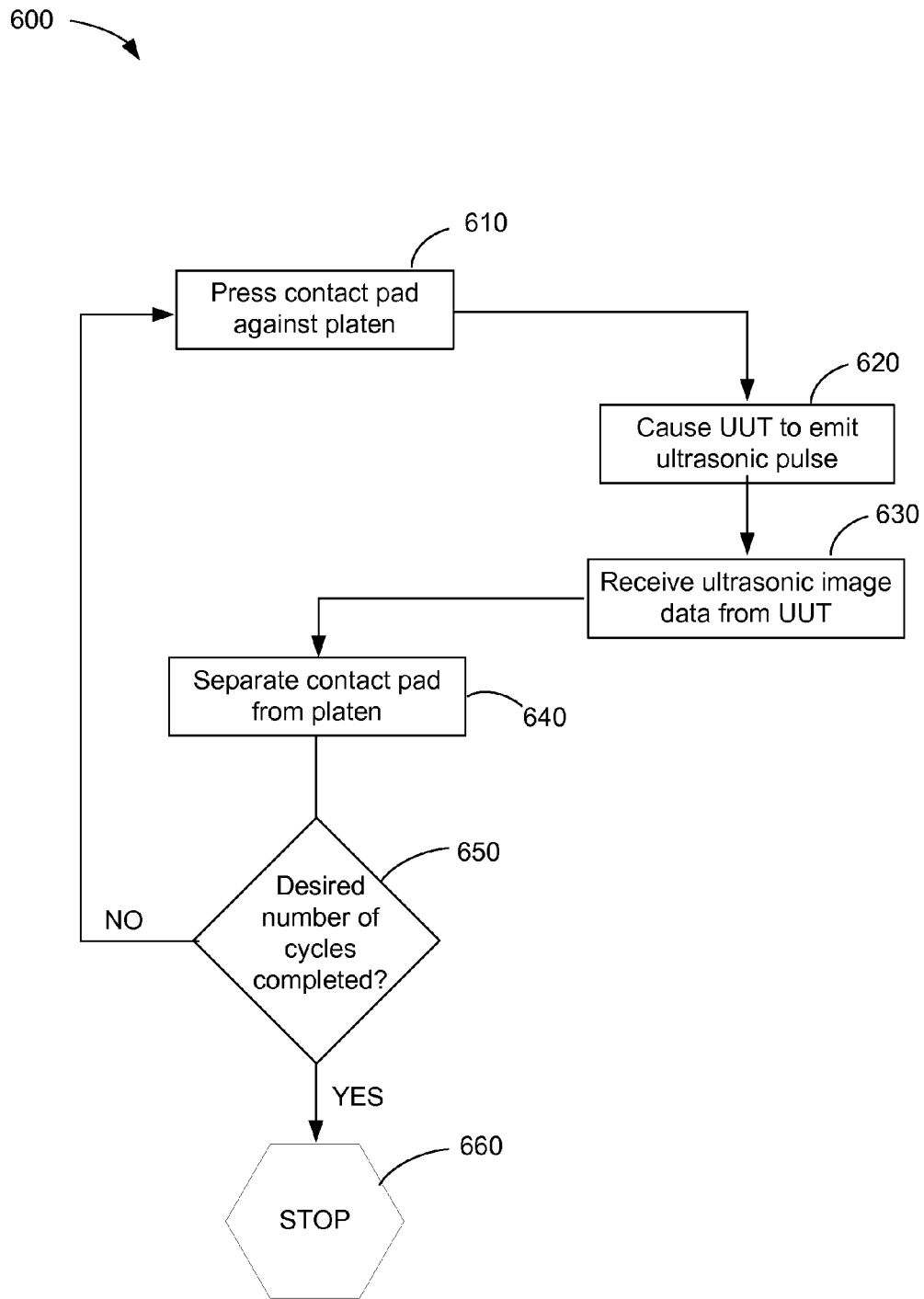
FIG. 6 illustrates a flow diagram for testing an ultrasonic sensor (UUT).

FIG. 6 illustrates a flow diagram for testing an ultrasonic sensor (UUT). According to the illustrated method 600, at block 610, a contact pad may be pressed against a platen of the UUT. As described above, the elastomeric pad may be disposed proximate to a distal portion of an articulable testing beam that is mechanically coupled with a cyclic actuator. The cyclic actuator may be controlled by a control electronics arrangement, as described above.

At block 620, the control electronics arrangement may cause the UUT to emit an ultrasonic pulse. For example, an ultrasonic transmitter of the UUT may be caused to emit an ultrasonic pulse. At block 630, the controller electronics arrangement may receive ultrasonic image data from the UUT. The ultrasonic image data may be processed so as to assemble a digital image of the surface of the contact pad.

At block 640, the contact pad may be separated from the platen of the UUT.

At block 650, a determination may be made as to whether a desired number of cycles have been completed. If the determination is that the desired number of cycles have been accomplished, the method may stop, block 660. On the other hand, if the determination is that the desired number of cycles has not been completed, the method may repeat execution of blocks 610 through 650.

Thus, techniques for efficient performance of cyclic life testing and high volume quality control testing of ultrasonic fingerprint sensors have been disclosed.

As used herein, a phrase referring to "at least one" of a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor or any conventional processor, controller, microcontroller or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that can be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and "bottom", "front" and "back", and "over", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

What is claimed is:

1. An apparatus for testing an ultrasonic sensor under test, the apparatus comprising:
a fingerprint impress simulator including a contact pad; and
a control electronics arrangement configured to operate the ultrasonic sensor under test and the fingerprint impress simulator, and to receive ultrasonic image data from the ultrasonic sensor under test, wherein the contact pad is fabricated from a material having one or more of a stiffness and an acoustic impedance characteristic that simulate skin of a finger and the fingerprint impress simulator is configured to cyclically press the contact pad against a platen of the ultrasonic sensor under test.

2. The apparatus of claim 1, wherein:
the ultrasonic sensor includes an ultrasonic transmitter and an ultrasonic sensor array disposed between the ultrasonic transmitter and the platen; and
the control electronics arrangement causes the ultrasonic transmitter to emit an ultrasonic pulse, and receives ultrasonic image data from the ultrasonic sensor array, the ultrasonic image data corresponding to a detected portion of the ultrasonic pulse.

3. The apparatus of claim 2, wherein:
the control electronics arrangement synchronizes a motion of the fingerprint impress simulator and operation of the ultrasonic sensor under test such that the detected portion of the ultrasonic pulse is reflected from the contact pad.

4. The apparatus of claim 1, wherein:
the fingerprint impress simulator includes (i) a plurality of elongated testing beams; (ii) a plurality of contact pads, each contact pad attached proximate to a distal end of a respective one of the plurality of elongated testing beams; and (iii) a mechanism configured to articulate the plurality of elongated testing beams so as to cyclically engage and disengage each contact with a respective ultrasonic sensor under test.

5. The apparatus of claim 4, wherein the mechanism includes a rotatable drum arrangement mechanically coupled with the respective elongated testing beams by a linkage arrangement, the linkage arrangement being configured to cause a rotation of the rotatable drum to result in articulation of the plurality of elongated testing beams so as to cyclically engage and disengage each contact pad with a respective ultrasonic sensor under test.

6. The apparatus of claim 5, wherein the linkage arrangement is configured to cyclically move the distal end of at least one of the plurality of elongated testing beams along a line of motion that is substantially orthogonal to a long axis of the elongated testing beam.

7. The apparatus of claim 6, wherein the linkage arrangement is configured to provide that a first edge portion of the contact pad makes an initial contact with a surface of the ultrasonic sensor and, only subsequent to the initial contact, a remaining portion of the contact pad is then pressed against the surface.

8. The apparatus of claim 7, wherein the linkage arrangement is configured to provide that a heel portion of the contact pad may be set to engage the surface prior to a toe portion.

9. The apparatus of claim 4, wherein the mechanism includes a stepper motor or a plurality of pneumatically or hydraulically driven pistons.

10. The apparatus of claim 5, wherein the linkage arrangement includes at least one of a cam, a roller, a bearing, a bushing, an integral cam, a protruding section, an offset cylinder and an eccentric.

11. The apparatus of claim 6 wherein the linkage arrangement is configured to move the distal end alternately in opposing directions along the line of motion.

12. The apparatus of claim 1, wherein the control electronics arrangement is configured to selectably control a pressure with which the fingerprint impress simulator presses the contact pad against the platen.

13. The apparatus of claim 1, wherein the contact pad is configured with a test pattern having a spatial frequency range simulating a fingerprint.

14. The apparatus of claim 1, wherein the control electronics arrangement sequences the fingerprint impress simulator through each of a plurality of ultrasonic sensors under test in round-robin fashion.

15. The apparatus of claim 1, wherein the control electronics arrangement generates a contrast transfer function output.

16. A method comprising:
cyclically pressing a contact pad against a platen of an ultrasonic sensor under test with a fingerprint impress simulator; and
operating, with a control electronics arrangement, the ultrasonic sensor under test and the fingerprint impress simulator, and receiving ultrasonic image data from the ultrasonic sensor under test, wherein the contact pad is fabricated from a material having one or more of a stiffness and an acoustic impedance characteristic that simulate skin of a finger.

17. The method of claim 16, wherein the ultrasonic sensor includes an ultrasonic transmitter and an ultrasonic sensor array disposed between the ultrasonic transmitter and the platen, the method including causing the ultrasonic transmitter to emit an ultrasonic pulse, and receiving ultrasonic image data from the ultrasonic sensor array, the ultrasonic image data corresponding to a detected portion of the ultrasonic pulse.

18. The method of claim 17, wherein:
the control electronics arrangement synchronizes a motion of the fingerprint impress simulator and operation of the ultrasonic sensor under test such that the detected portion of the ultrasonic pulse is reflected from the contact pad.

19. The method of claim 16, wherein:
the fingerprint impress simulator includes (i) a plurality of elongated testing beams; (ii) a plurality of contact pads, each contact pad attached proximate to a distal end of a respective one of the plurality of elongated testing beams; and (iii) a mechanism that articulates the plurality of elongated testing beams so as to cyclically engage and disengage each contact pad with a respective ultrasonic sensor under test.

20. The method of claim 19, wherein the mechanism includes a rotatable drum arrangement mechanically coupled with the respective elongated beams by a linkage arrangement, the linkage arrangement being configured to cause a rotation of the rotatable drum to result in articulation of the plurality of elongated testing beams so as to cyclically engage and disengage each contact with a respective ultrasonic sensor under test.

21. The method of claim 16, wherein the control electronics arrangement is configured to selectably control a pressure with which the fingerprint impress simulator engages the contact pads with the respective ultrasonic sensors.

22. The method of claim 16, further comprising generating a contrast transfer function output.

23. A non-transitory computer readable medium having software stored thereon, the software including instructions for causing an apparatus to:
cyclically press an contact pad against a platen of an ultrasonic sensor under test with a fingerprint impress simulator; and
operate, with a control electronics arrangement, the ultrasonic sensor under test and the fingerprint impress simulator, and receive ultrasonic image data from the ultrasonic sensor under test, wherein the contact pad is fabricated from a material having one or more of a stiffness and an acoustic impedance characteristic that simulate skin of a finger.

24. The computer readable medium of claim 23, wherein:
the fingerprint impress simulator includes (i) a plurality of elongated testing beams; (ii) a plurality of contact pads, each contact pad attached proximate to a distal end of a respective one of the plurality of elongated testing beams; and (iii) a mechanism that articulates the plurality of elongated testing beams so as to cyclically engage and disengage each contact pad with a respective ultrasonic sensor under test.

25. The computer readable medium of claim 23, wherein:
the control electronics arrangement is configured to selectably control a pressure with which the fingerprint impress simulator engages the contact pads with the respective ultrasonic sensors.

26. An apparatus comprising:
a fingerprint impress simulator configured to cyclically press a contact pad against a platen of an ultrasonic sensor under test; and
means for operating the ultrasonic sensor under test and the fingerprint impress simulator, and receiving ultrasonic image data from the ultrasonic sensor under test, wherein the contact pad is fabricated from a material having one or more of a stiffness and an acoustic impedance characteristic that simulate skin of a finger.

27. The apparatus of claim 26, wherein:
the fingerprint impress simulator includes (i) a plurality of elongated testing beams; (ii) a plurality of contact pads, each contact pad attached proximate to a distal end of a respective one of the plurality of elongated testing beams; and (iii) a mechanism that articulates the plurality of elongated testing beams so as to cyclically engage and disengage each contact with a respective ultrasonic sensor under test.

28. The apparatus of claim 27, wherein the mechanism includes a rotatable drum arrangement mechanically coupled with the plurality of elongated testing beams by a linkage arrangement, the linkage arrangement being configured to cause a rotation of the rotatable drum to result in articulation of the plurality of elongated testing beams so as to cyclically engage and disengage each contact pad with a respective ultrasonic sensor under test.

* * * * *